(12) United States Patent
Yeon et al.

(10) Patent No.: US 12,248,695 B2
(45) Date of Patent: *Mar. 11, 2025

(54) CONTROLLER AND OPERATION METHOD THEREOF

(71) Applicant: SK hynix Inc., Gyeonggi-do (KR)

(72) Inventors: Jae Wan Yeon, Gyeonggi-do (KR); Do Hun Kim, Gyeonggi-do (KR); Ju Hyun Kim, Gyeonggi-do (KR); Jin Yeong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 35 days.

This patent is subject to a terminal disclaimer.

(21) Appl. No.: 18/460,705

(22) Filed: Sep. 5, 2023

(65) Prior Publication Data

US 2023/0409228 A1     Dec. 21, 2023

Related U.S. Application Data

(63) Continuation of application No. 17/536,712, filed on Nov. 29, 2021, now Pat. No. 11,789,637.

(30) Foreign Application Priority Data

Jun. 21, 2021     (KR) .......................... 10-2021-0079965

(51) Int. Cl.
    *G06F 3/06*     (2006.01)
(52) U.S. Cl.
    CPC ............ *G06F 3/065* (2013.01); *G06F 3/0619* (2013.01); *G06F 3/0656* (2013.01); *G06F 3/0659* (2013.01); *G06F 3/0673* (2013.01)

(58) Field of Classification Search
    CPC ...... G06F 3/065; G06F 3/0619; G06F 3/0656; G06F 3/0659; G06F 3/0673; G06F 3/0679; G06F 3/061; G06F 3/064; G06F 3/0614; G06F 3/0658; G06F 11/1446; G11C 16/08; G11C 16/0483; G11C 16/10;
    (Continued)

(56) References Cited

U.S. PATENT DOCUMENTS

| 11,789,637 | B2 * | 10/2023 | Yeon | ...................... G06F 3/065 |
| | | | | 711/162 |
| 2013/0080688 | A1 * | 3/2013 | Park | ...................... G06F 3/0659 |
| | | | | 711/E12.008 |

(Continued)

*Primary Examiner* — Hiep T Nguyen
(74) *Attorney, Agent, or Firm* — IP & T GROUP LLP

(57) ABSTRACT

An operation method includes buffering data chunks to be programmed in the multi-level cells in a write buffer; backing up at least one backup data chunk of the data chunks to a backup memory; determining a program sequence of the data chunks, the program sequence for programming a non-backup data chunk among the data chunks to the multi-level cells through a second step program operation of the multi-step program operation; and controlling the memory device to program the data chunks in the multi-level cells, based on the program sequence, by performing first and second step program operations of the multi-step program operation in a first page of the multi-level cells, the second step program operation performed in the first page later than another first step program operation performed in a second page subsequent to the first page.

20 Claims, 10 Drawing Sheets

(58) Field of Classification Search
CPC .... G11C 2211/5642; G11C 2211/5648; G11C 11/5671; Y02D 10/00
See application file for complete search history.

(56) References Cited

U.S. PATENT DOCUMENTS

| | | | |
|---|---|---|---|
| 2013/0173848 A1* | 7/2013 | Lassa | G06F 3/065 |
| | | | 711/E12.008 |
| 2019/0164612 A1* | 5/2019 | Solanki | G11C 16/0483 |
| 2019/0317691 A1* | 10/2019 | Kanno | G06F 3/0679 |
| 2020/0310677 A1* | 10/2020 | Byun | G06F 3/0656 |

* cited by examiner

FIG. 6

Page14

600

|  |  | DSL1 | DSL2 | DSL3 | DSL4 | DSL5 | DSL6 | DSL7 | DSL8 |
|---|---|---|---|---|---|---|---|---|---|
| WL1 | 1st bit | 1 | 2 | 3 | 4 | 5 | 6 | 7 | 8 |
|  | 2nd bit | 10 | 12 | 14 | 16 | 18 | 20 | 22 | 24 |
| WL2 | 1st bit | 9 | 11 | 13 | 15 | 17 | 19 | 21 | 23 |
|  | 2nd bit | 26 | 28 | 30 | 32 | 34 | 36 | 38 | 40 |
| WL3 | 1st bit | 25 | 27 | 29 | 31 | 33 | 35 | 37 | 39 |
|  | 2nd bit | ... | ... | ... | ... | ... | ... | ... | ... |
| ... |  |  |  |  |  |  |  |  |  |

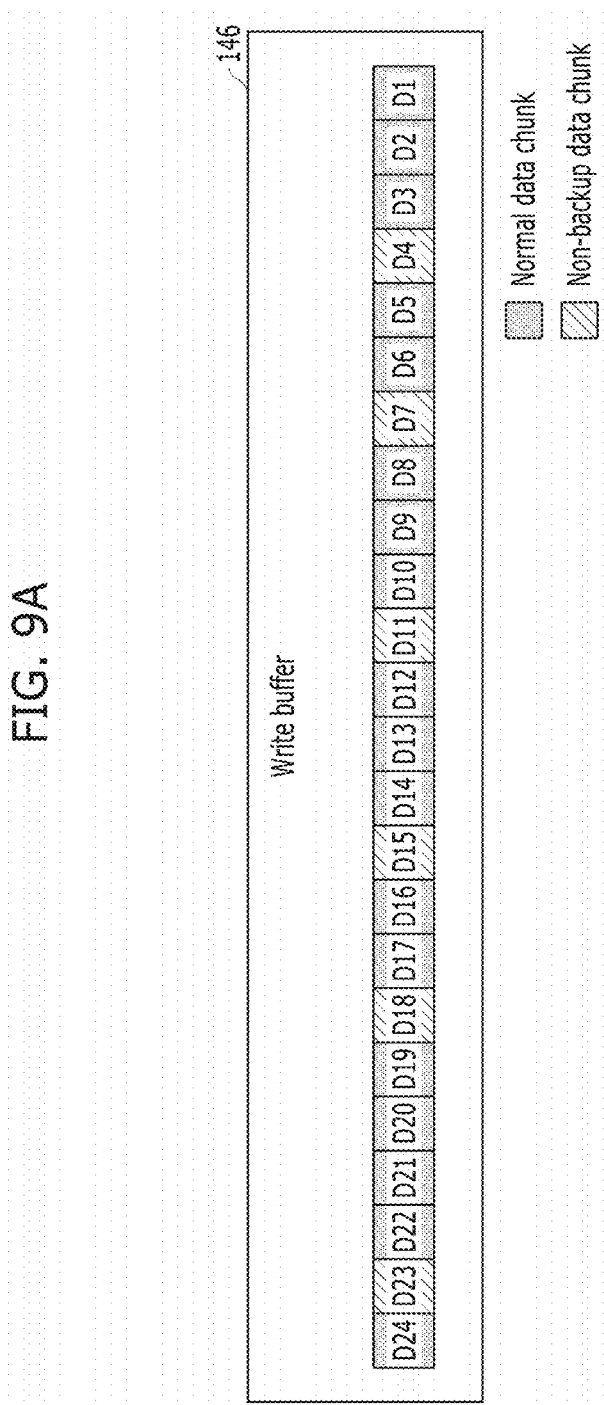

FIG. 9B

|  |  |  | DSL1 | DSL2 | DSL3 | DSL4 | DSL5 | DSL6 | DSL7 | DSL8 |
|---|---|---|---|---|---|---|---|---|---|---|
| WL1 | 1st bit | PO / D | 1 / D1 | 2 / D2 | 3 / D3 | 4 / D5 | 5 / D6 | 6 / D8 | 7 / D9 | 8 / D10 |
|  | 2nd bit | PO / D | 10 / D4 | 12 / D7 | 14 / D11 | 16 / D15 | 18 / D18 | 20 / D20 | 22 / D22 | 24 / D23 |
| WL2 | 1st bit | PO / D | 9 / D12 | 11 / D13 | 13 / D14 | 15 / D16 | 17 / D17 | 19 / D19 | 21 / D21 | 23 / D24 |
|  | 2nd bit | PO / D | 26 | 28 | 30 | 32 | 34 | 36 | 38 | 40 |
| WL3 | 1st bit | PO / D | 25 | 27 | 29 | 31 | 33 | 35 | 37 | 39 |
|  | 2nd bit |  | ... | ... | ... | ... | ... | ... | ... | ... |
| ... |  |  |  |  |  |  |  |  |  |  |

▨ Normal data chunk programmed
▨ Non-backup data chunk programmed
☐ Erased

900

CONTROLLER AND OPERATION METHOD THEREOF

CROSS-REFERENCE TO RELATED APPLICATIONS

This patent application is a Continuation of U.S. patent application Ser. No. 17/536,712 filed on Nov. 29, 2021, which claims the benefit of Korean Patent Application No. 10-2021-0079965, filed on Jun. 21, 2021, the entire disclosure of which is incorporated herein by reference.

TECHNICAL FIELD

Various embodiments of the present disclosure described herein relate to a controller and an operation method thereof.

BACKGROUND

A paradigm for a computing environment has shifted to ubiquitous computing, which enables computer systems to be accessed virtually anytime and anywhere. The use of portable electronic devices (e.g., mobile phones, digital cameras, notebook computers, or the like) is rapidly increasing. Such portable electronic devices may use or include a memory system having at least one memory device. The memory system may be a data storage device. The data storage device can be used as a main storage device or an auxiliary storage device of a portable electronic device.

Unlike a hard disk, such a data storage device uses non-volatile semiconductor memories, exhibits improved stability and durability, has no mechanical driving parts (e.g., a mechanical arm), and thus provides high data access speeds and relatively low power consumption. Examples of a data storage device having such advantages include, but are not limited to, Universal Serial Bus (USB) memory devices, memory cards having various interfaces, solid state drives (SSDs), and so on.

BRIEF DESCRIPTION OF THE DRAWINGS

The description herein makes reference to the accompanying drawings wherein like reference numerals refer to like parts throughout the figures.

FIG. 6 illustrates a program sequence of data in a memory device performing a multi-step program operation according to an embodiment of the present disclosure.

FIGS. 9A and 9B illustrate operations performed by a controller according to an embodiment of the present disclosure.

DETAILED DESCRIPTION

Figure 1:
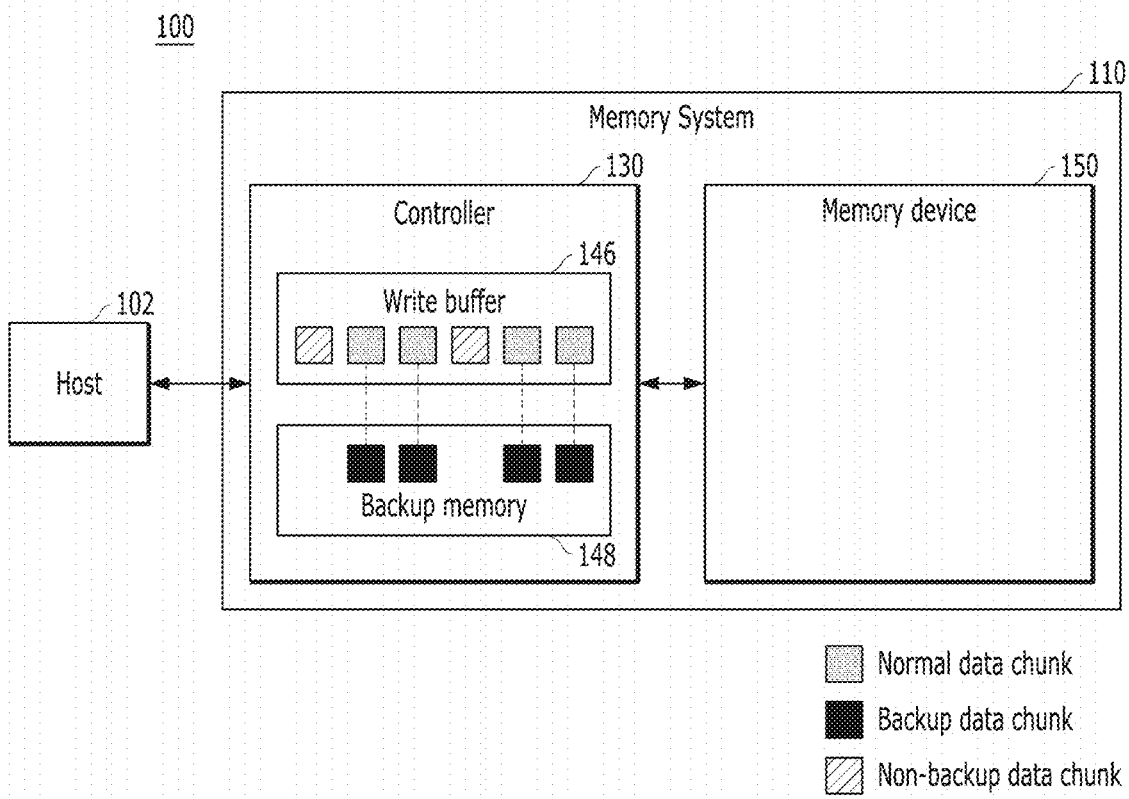
FIG. 1 is a diagram illustrating an example of a data processing system including a memory system according to an embodiment of the present disclosure.

Various embodiments of the present disclosure are described below with reference to the accompanying drawings. Elements and features of the present disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the present disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Embodiments of the present disclosure provide a controller and an operating method of the controller capable of reducing a manufacturing cost of a memory system while improving or maintaining performance and reliability of the memory system.

In an embodiment of the present disclosure, an operation method of controller is for controlling a memory device including multi-level cells programmed with data through a multi-step program operation. The operation method can include buffering data chunks to be programmed in the multi-level cells in a write buffer; backing up some of the data chunks to a backup memory which is distinguished from the write buffer; determining a program sequence of the data chunks, the program sequence for programming at least one non-backup data chunk of the data chunks to the multi-level cells through a second step program operation of the multi-step program operation; and controlling the memory device to program the data chunks in the multi-level cells, based on the program sequence, by performing first and second step program operations of the multi-step program operation in a first page of the multi-level cells, the second step program operation performed in the first page later than another first step program operation performed in a second page subsequent to the first page.

The determining the program sequence can include determining the program sequence for programming the at least one backup data chunk of the data chunks through the first or second step program operation.

The determining the program sequence can further include determining the program sequence for programming a first chunk of the at least one backup data chunk through the first step program operation; determining the program sequence programming the at least one non-backup data chunk through the second step program operation when the at least one non-backup data chunk is buffered in the write buffer; and determining the program sequence for programming a second chunk of the at least one backup data chunk through the second step program operation when there is no non-backup data chunk.

The operation method can further include transferring each non-backup data chunk in the write buffer to the memory device; and releasing the transferred non-backup data chunk from the write buffer after performing the second step program operation regarding the transferred non-backup data chunk.

The operation method can further include re-transferring the transferred non-backup data chunk to the memory device when the second step program operation regarding the non-backup data chunk has failed.

The operation method can further include transferring each backup data chunk to the memory device; and releasing the transferred backup data chunk from the write buffer after transferring the transferred backup data chunk and before performing the first or the second step program operation regarding the transferred backup data chunk.

The operation method can further include releasing the transferred backup data chunk from the backup memory after completely performing the first or second step program operation regarding the transferred backup data chunk.

The operation method can further include re-transferring the transferred backup data chunk to the memory device when the first or second step program operation regarding the transferred backup data chunk has failed.

The backing up the at least one backup data chunk of the data chunks can include discarding at least one data chunk of the data chunks transferred into the backup memory to avoid a bottleneck in a data path in which the data chunks input from a host are transmitted. The write buffer can have a faster I/O operation speed than the backup memory.

The backing up the at least one backup data chunk of the data chunks can include buffering at least one data chunk of the data chunks in a temporary buffer when there is an available space in the temporary buffer and then backing up the at least one data chunk, buffered in the temporary buffer, in the backup memory; and discarding the at least data chunk of the data chunks when there is no available space in the temporary buffer.

In another embodiment of the present disclosure, a controller for controlling a memory device including multi-level cells programmed with data through a multi-step program operation can include a write buffer configured to buffer data chunks to be programmed in the multi-level cells; a backup memory distinguished from the write buffer and configured to back up at least one backup data chunk of the data chunks; and a processor configured to determine a program sequence of the data chunks, the program sequence for programming at least one non-backup data chunk of the data chunks to the multi-level cells through a second step program operation of the multi-step program operation. The processor can be configured to control the memory device to program the data chunks in the multi-level cells, based on the program sequence, by performing first and second step program operations of the multi-step program operation in a first page of the multi-level cells, the second step program operation performed in the first page later than another first step program operation performed in a second page subsequent to the first page.

The processor can be configured to determine the program sequence for programming the at least one backup data chunk of the buffered data chunks through the first or second step program operation.

The processor can be configured to: determine the program sequence for programming a first chunk of the at least one backup data chunk through the first step program operation; determine the program sequence for programming the at least one non-backup data chunk through the second step program operation when the at least one non-backup data chunk is buffered in the write buffer; and determine the program sequence for programming a second chunk of the at least one backup data chunk through the second step program operation when there is no non-backup data chunk.

The processor can be configured to: transfer each non-backup data chunk to the memory device; and release the transferred non-backup data chunk from the write buffer after performing the second step program operation regarding the transferred non-backup data chunk.

The processor can be configured to re-transfer the transferred non-backup data chunk to the memory device when the second step program operation regarding the transferred non-backup data chunk has failed.

The processor can be configured to: transfer each backup data chunk to the memory device; and release the transferred backup data chunk from the write buffer and before performing the first or the second step program operation regarding the transferred backup data chunk.

The processor can be configured to release the transferred backup data chunk from the backup memory after performing the first or second step program operation regarding the transferred backup data chunk.

The processor can be configured to re-transfer the transferred backup data chunk to the memory device when the first or second step program operation regarding the transferred backup data chunk has failed.

The backup memory can be configured to discard or back up at least one data chunk of the data chunks, to avoid a bottleneck in a data path in which the data chunks input from the host are transmitted. The write buffer can have an operation speed faster than that of the backup memory.

The controller can further include a temporary buffer located on the data path where the data chunks are transferred. The temporary buffer can be configured to: buffer at least one data chunk of the data chunks when there is an available space in the temporary buffer and then backing up the at least one data chunk in the backup memory; and discard at least data chunk of the data chunks when there is no available space in the temporary buffer.

In another embodiment of the present disclosure, a controller for controlling a memory device including multi-level cells programmed with data through a multi-step program operation can include a write buffer configured to buffer data chunks to be programmed in the multi-level cells; a backup memory distinguished from the write buffer and configured to back up at least one backup data chunk of the data chunks; and a processor configured to determine a program sequence of the data chunks buffered in the write buffer, the program sequence for programming at least one non-backup data chunk among the data chunks to the multi-level cells through a second step program operation of the multi-step program operation. The processor can be configured to control the memory device to program the data chunks in the multi-level cells, based on the program sequence, by performing first and second step program operations of the multi-step program operation in a first page of the multi-level cells, the second step program operation performed in the first page later than another first step program operation performed in a second page subsequent to the first page, and re-transfer the at least one non-backup data chunk to the memory device when the second step program operation regarding the non-backup data chunk has failed.

In another embodiment of the present disclosure, a memory system can include a memory device including multi-level cells; and a controller coupled to the memory device and including: a write buffer configured to buffer multiple data chunks received from a host, a temporary buffer configured to buffer backup data chunks selected from among the multiple data chunks, based on an available space of the temporary buffer, a backup memory configured to receive and store the backup data chunks from the temporary buffer, and a processor configured to: provide the buffered multiple data chunks to the memory device for programming in the multi-level cells, release, from the write buffer, the backup data chunks among the buffered multiple data chunks, when the buffered multiple data chunks are provided to the memory device, control the memory device to program the buffered multiple data chunks in the multi-level cells, and release, from the write buffer, one or more non-backup data chunks excluding the backup data chunks among the buffered multiple data chunks and release, from the backup memory, the backup data chunks, when the buffered multiple data chunks are programmed successfully in the multi-level cells. The multi-level cells can include multiple pages coupled between multiple word lines and multiple select lines, respectively, each page including a first sub-page and a second sub-page. The controller can be configured to control the memory device such that a second sub-page of a first word line is programmed later than a first sub-page of a second word line.

Embodiments of the present disclosure will now be described with reference to the accompanying drawings, wherein like numbers reference like elements.

FIG. 1 is a diagram illustrating an example of a data processing system 100 including a memory system according to an embodiment of the present disclosure.

Referring to FIG. 1, the data processing system 100 can include a host 102 and a memory system 110.

The host 102 may include a portable electronic device (e.g., a mobile phone, an MP3 player, a laptop computer, etc.) or a non-portable electronic device (e.g., a desktop computer, a game player, a television, a projector, etc.).

The host 102 may also include at least one operating system (OS), which can control functions and operations performed in the host 102. The OS can provide interoperability between the host 102 engaged operatively with the memory system 110 and a user who intends to store data in the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user environment. As compared with the personal operating system, the enterprise operating systems can be specialized for securing and supporting high performance computing.

The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests to the memory system 110, thereby performing operations corresponding to the plurality of commands within the memory system 110.

The memory system 110 can perform an operation for storing data input from the host 102 in response to a request of the host 102. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components may be added to or omitted from a controller 130 according to an implementation of the memory system 110.

Further, the memory system 110 may be implemented by various types of storage devices. For example, the storage device includes a volatile memory device such as a dynamic random access memory (DRAM), a static RAM (SRAM), a read only memory (ROM), a mask ROM (MROM), a programmable ROM (PROM), an erasable programmable ROM (EPROM), an electrically erasable programmable ROM (EEPROM), a ferromagnetic RAM (FRAM), a phase change RAM (PRAM), a magnetic RAM (MRAM), a resistive RAM (RRAM), a non-volatile memory device such as a flash memory, and the like.

The memory system 110 may include a controller 130 and a memory device 150. The memory device 150 may store data for the host 102, and the controller 130 may control a data storage procedure in the memory device 150.

The controller 130 and the memory device 150 may be integrated into a single semiconductor device. In an embodiment, the controller 130 and the memory device 150 may be integrated into a single semiconductor device such as a Solid State Drive (SSD). When the memory system 110 is used as the SSD, an operating speed of the host 102 coupled to the memory system 110 may be improved. In another embodiment, the controller 130 and the memory device 150 may be integrated into a single semiconductor device such as a memory card. For example, the controller 130 and the memory device 150 may include a PC card (PCMCIA: Personal Computer Memory Card International Association), a compact flash card (CF), a smart media card (e.g., SM, SMC), a memory stick, a multimedia card such as MMC, RS-MMC, MMCmicro, a SD card such as SD, miniSD, microSD, SDHC, a Universal Flash Storage (UFS), and the like.

In another example, the memory system 110 can be included in one of a computer, an Ultra Mobile PC (UMPC), a workstation, a net-book, a Personal Digital Assistants (PDA), a portable computer, a web tablet, a tablet computer, a wireless phone, a mobile phone, a smart phone, an e-book device, a portable multimedia player (PMP), a portable game machine, a navigation device, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a data center storage, a device capable of transmitting and receiving information in a wireless environment, one of various electronic devices constituting a home network, one of various electronic devices constituting a computer network, one of various electronic devices constituting a telematics network, a radio frequency identification (RFID) device, one of various components constituting a computing system, and the like.

The memory device 150 may be a non-volatile memory device, so that stored data may be retained even when power is not supplied. The memory device 150 may store data input from the host 102 through a program operation and may provide data stored in the memory device 150 to the host 102 through a read operation. The memory device 150 may include a plurality of memory blocks. Each block may include a plurality of pages. Each page may include a plurality of memory cells connected to a word line. In an embodiment, the memory device 150 may include a flash memory. The flash memory may have a three-dimensional stack structure.

The controller 130 may control the memory device 150 in response to a request from the host 102. For example, the controller 130 may provide data read from the memory device 150 to the host 102, and store the data provided from the host 102 in the memory device 150. For example, the controller 130 may control an operation such as a read, program, or erase operation performed in the memory device 150.

The controller 130 may include a write buffer 146. The controller 130 may buffer data to be programmed into the memory device 150, e.g., data input along with a write request from the host 102, in the write buffer 146. The controller 130 may control the memory device 150 to program the data while transferring the data buffered in the write buffer 146 to the memory device 150.

In a case when the program operation performed in the memory device 150 fails, the controller 130 can keep or maintain the data inside the controller 130 until successfully completing the program operation in the memory device 150 after transmitting the data to the memory device 150.

The write buffer 146 may be implemented with a high-speed memory, such as a SRAM, to quickly handle a write request. The high-speed memory can provide a faster access speed than that of a general memory such as DRAM, but the high-speed memory may have a low density and a high manufacturing cost. If the controller 130 has to maintain data to be programmed in the memory device 150 in the write buffer 146 until the program operation regarding the data is successfully completed, the write buffer 146 might be required to have a large capacity. When the write buffer 146 having a large capacity is included in the memory system 110, a circuit area of the memory system 110 may increase and a manufacturing cost of the memory system 110 may increase.

The controller 130 may include a backup memory 148 for holding data to be programmed until the program operation regarding the data is successfully completed. The controller 130 may buffer data input from the host 102 in the write buffer 146, and back up the data in the backup memory 148. When all data buffered in the write buffer 146 is backed up in the backup memory 148, the controller 130 can release data from the write buffer 146 after transferring the data buffered in the write buffer 146 to the memory device 150.

The backup memory 148 may be implemented as a low-speed memory such as a DRAM. The low-speed memory may have a higher degree of integration and a lower manufacturing cost than those of the high-speed memory such as a SRAM. When the controller 130 includes the backup memory 148, data to be programmed in the memory device 150 can be maintained in the controller 130. Even if the program operation regarding the data in the memory device 150 fails, operational reliability of the memory system 110 can be maintained. Further, a circuit area and a manufacturing cost of the memory system 110 can be reduced.

When a speed at which new data is backed up to the backup memory 148 is faster than a speed at which data backed up in the backup memory 148 is removed, a bottleneck may occur in the backup memory 148. If the controller 130 would back up all data buffered in the write buffer 146 to the backup memory 148, some data might not be buffered in the write buffer 146 when the bottleneck occurs in the backup memory 148. When the bottleneck occurs in the backup memory 148, write performance of the memory system 110 may be deteriorated even if the write buffer 146 can have a sufficiently fast data transfer rate.

According to an embodiment of the present disclosure, the controller 130 may discard some data buffered in the write buffer 146, without backing up in the backup memory 148, to avoid the bottleneck in the backup memory 148. In the illustrated example of FIG. 1, the write buffer 146 may buffer a plurality of data chunks. At least some data chunks among the plurality of data chunks buffered in the write buffer 146 may be backed up in the backup memory 148. The other data chunks might not be backed up, i.e., discarded, in the backup memory 148.

Each of data chunks backed up in the backup memory 148 may be referred to as a backup data chunk. The backup data chunk is shown as a shaded rectangle in FIG. 1. Each of data chunks among the data chunks buffered in the write buffer 146, which corresponds to the backup data chunk, may be referred to as a normal data chunk which is shown as a rectangle with a dot pattern indicated in FIG. 1. When a data chunk buffered in the write buffer 146 is the normal data chunk, the same data chunk is stored as the backup data chunk in the backup memory 148. Each data chunk among the data chunks buffered in the write buffer 146 but not backed up in the backup memory 148 may be referred to as a non-backup data chunk. The non-backup chunk is illustrated as a rectangle with a hatched pattern in FIG. 1. The normal data chunk and the backup data chunk connected through a broken line in FIG. 1 may represent the same data chunk, i.e., data chunks having the same value.

Even if the normal data chunk is released, e.g., removed, from the write buffer 146 after the normal data chunk is transferred to the memory device 150, the controller 130 can keep the same data chunk because the normal data chunk is backed up as the backup data memory in the backup memory 148. On the other hand, in order to keep the non-backup data chunk in the controller 130, the controller 130 might not release the non-backup data chunk from the write buffer 146 until the non-backup data chunk is successfully programmed in the memory device 150.

According to an embodiment of the present disclosure, the controller 130 can reduce a time of holding the non-backup data chunk stored in the write buffer 146, in order to minimize a storage capacity required in the write buffer 146. The controller 130 could keep or hold data chunks until the corresponding data chunks are programmed successfully in the memory device 150. Hereinafter, a method for quickly releasing non-backup data chunks from the write buffer 146 to avoid data chunk accumulation in the write buffer 146 is described in detail with reference to FIGS. 2 to 9B.

Figure 2:
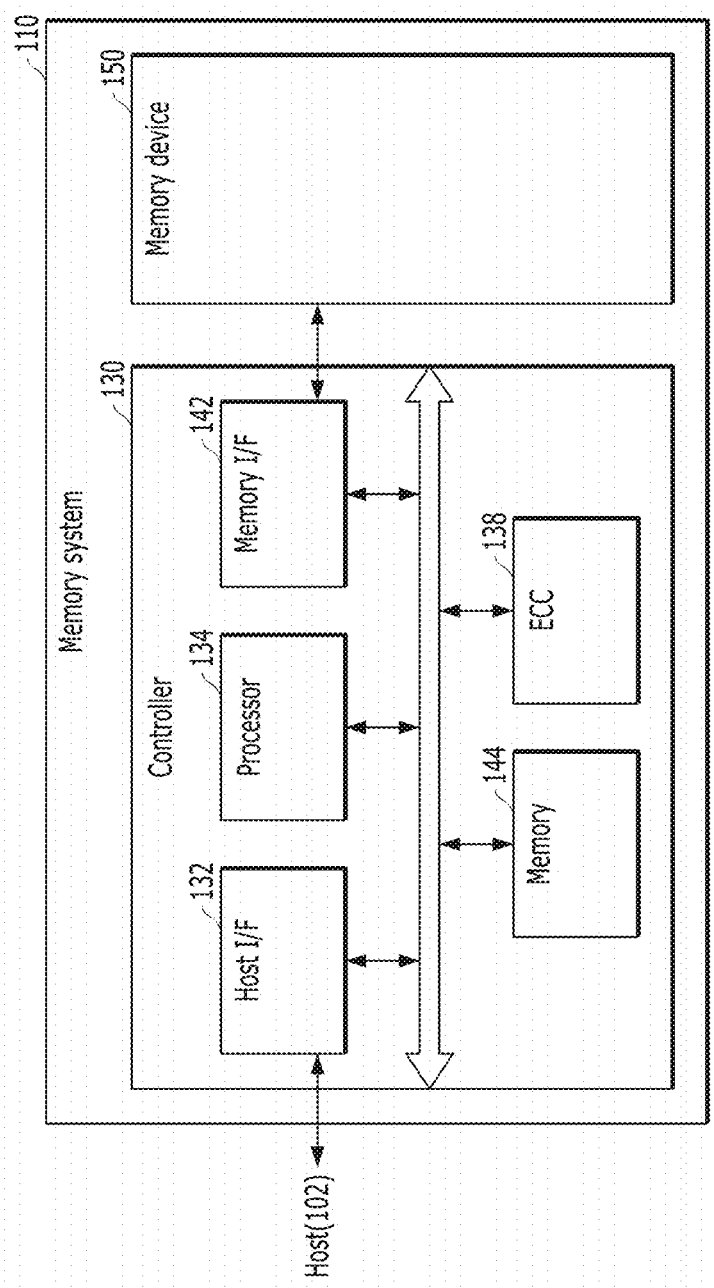
FIG. 2 illustrates a memory system according to an embodiment of the present disclosure.

FIG. 2 illustrates a memory system 110 according to an embodiment of the present disclosure.

The memory system 110 may include the controller 130 and the memory device 150. The controller 130 and the memory device 150 shown in FIG. 2 can correspond to the controller 130 and the memory device 150 described in FIG. 1.

The controller 130 can include a host interface (I/F) 132, a processor 134, error correction circuitry 138, a memory interface 142 and a memory 144, which are operably connected to each other through an internal bus.

The host interface 132 may receive signals, commands (or requests), and/or data input from the host 102. For example, the host 102 and the memory system 110 may use at least one of various communication protocols (standards) or interfaces to transmit and receive data therebetween. Examples of protocols or interfaces supported by the host 102 and the memory system 110 for sending and receiving data include a Universal Serial Bus (USB), a Multi-Media Card (MMC), a Parallel Advanced Technology Attachment (PATA), a Small Computer System Interface (SCSI), an Enhanced Small Disk Interface (ESDI), an Integrated Drive Electronics (IDE), a Peripheral Component Interconnect Express (PCIe), a Serial-attached SCSI (SAS), a Serial Advanced Technology Attachment (SATA), a Mobile Industry Processor Interface (MIPI), and the like. According to an embodiment, the host interface 132 is a type of layer for exchanging data with the host 102 and is implemented with, or driven by, firmware called a host interface layer (HIL).

The error correction circuitry 138 can correct error bits of data read from the memory device 150, and may include an error correction code (ECC) encoder and an ECC decoder. The ECC encoder may perform error correction encoding of data to be programmed in the memory device 150 to generate encoded data into which a parity bit is added, and store the encoded data in memory device 150. The ECC decoder can detect and correct error bits contained in the data read from the memory device 150 when the controller 130 reads the data stored in the memory device 150. For example, after performing error correction decoding on the data read from the memory device 150, the error correction circuitry 138 determines whether the error correction decoding has succeeded or not, and outputs an instruction signal (e.g., a correction success signal or a correction fail signal), based on a result of the error correction decoding. The error correction circuitry 138 may use a parity bit, which has been generated during the ECC encoding process for the data stored in the memory device 150, in order to correct the error bits of the read data. When the number of the error bits is greater than or equal to the number of correctable error bits, the error correction circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above-described codes.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 in a case when the memory device 150 is a flash memory.

For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) for exchanging data with the memory device 150.

According to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like.

In an embodiment, the processor 134 in the controller 130 may perform an operation corresponding to a request or a command input from the host 102. In another embodiment, the memory system 110 may perform an operation independent from a command or a request input from the host 102. An operation performed by the controller 130 in response to the request or the command input from the host 102 may be considered a foreground operation, while an operation performed by the controller 130 independently from the request or the command input from the host 102 may be considered a background operation. The controller 130 can perform foreground or background operations for reading, writing, or erasing data in the memory device 150. In an embodiment, a parameter set operation corresponding to a set parameter command or a set feature command as a set command transmitted from the host 102 may be considered a foreground operation. In an embodiment, as a background operation that is performed without a command transmitted from the host 102, the controller 130 can perform garbage collection (GC), wear leveling (WL), bad block management for identifying and processing bad blocks, or the like.

The memory 144 may be used as a working memory of the memory system 110 or the controller 130, while temporarily storing transactional data associated with operations performed in the memory system 110 and the controller 130. For example, the memory 144 may temporarily store read data output from the memory device 150 in response to a read request from the host 102 before the read data is output to the host 102. In another example, the controller 130 may temporarily store write data input from the host 102 in the memory 144 before programming the write data in the memory device 150. When the controller 130 controls operations, such as a data read operation, a data write or program operation, a data erase operation, etc., of the memory device 150, data transmitted and received between the controller 130 and the memory device 150 of the memory system 110 may be temporarily stored in the memory 144.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

Figure 3:
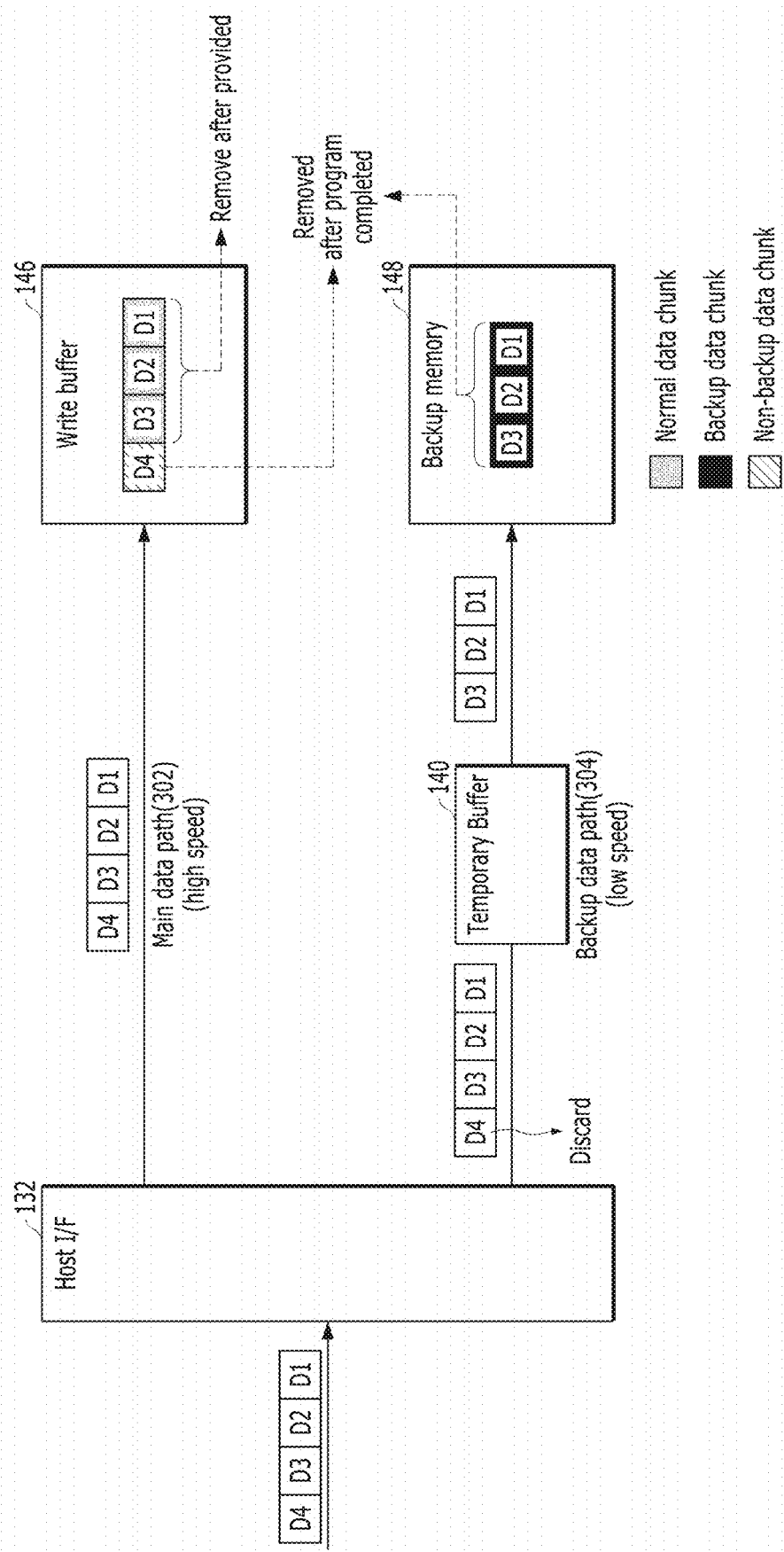
FIG. 3 illustrates a data path of data input from a host according to an embodiment of the present disclosure.

In various embodiments, the memory 144 in FIG. 2 can include the write buffer 146 and the backup memory 148 described with reference to FIG. 1. Referring to FIG. 3, a data path in which the controller 130 buffers data chunks input from the host 102 in the write buffer 146 and backs up some of the data chunks in the backup memory 148 is described in detail.

FIG. 3 describes a data path of data input from the host 102 according to an embodiment of the present disclosure.

FIG. 3 shows some components of the controller 130 described with reference to FIGS. 1 and 2. Specifically, FIG. 3 shows the host interface 132, the write buffer 146, and the backup memory 148.

In FIG. 3, there are a main data path 302 and a backup data path 304 in the controller 130. The main data path 302 may refer to a path in which a data chunk is received from the host 102 and transferred for buffering in the write buffer 146. The backup data path 304 may refer to a path in which a data chunk is received from the host 102 and transferred for backing up to the backup memory 148.

The controller 130 can further include a temporary buffer 140. Data chunks from the host 102 can be input via the host interface 132 and transferred via the temporary buffer 140 to be backed up to the backup memory 148. The temporary buffer 140 may be included in the memory 144 shown in FIG. 2.

The controller 130 may avoid a bottleneck via the backup data path 304. The controller 130 can selectively back up or discard some data chunks input from the host 102, in order to maintain or improve write operation performance of the memory system 110.

In FIG. 3, the host interface 132 can receive first to fourth data chunks D1, D2, D3, D4 from the host 102, and transfer the data chunks D1 to D4 to both the main data path 302 and the backup data path 304. The write buffer 146 may buffer all of the first to fourth data chunks D1 to D4 transferred through the main data path 302. In contrast, the temporary buffer 140 may selectively buffer data chunks transferred through the backup data path 304 depending on whether there is an available space for buffering a data chunk in the temporary buffer 140. For example, the temporary buffer 140 may buffer the first to third data chunks D1-D3 sequentially transferred via the backup data path 304. Then, when there is no more available space in the temporary buffer 140, the fourth data chunk D4 can be discarded without being buffered in the temporary buffer 140. The temporary buffer 140 may transfer the first to third data chunks D1 to D3, which are buffered in the temporary buffer 140, to the backup memory 148.

In FIG. 3, the first to third data chunks D1 to D3 among the data chunks D1 to D4 buffered in the write buffer 146 are considered the normal data chunk, while the fourth data chunk D4 is considered the non-backup data chunk. The first to third data chunks D1 to D3 are backed up in the backup memory 148 and are considered the backup data chunk. Thus, the normal data chunk is substantially the same as the backup data chunk.

The processor 134 may control a program operation on the memory device 150 after transferring the first to fourth data chunks D1 to D4 to the memory device 150. The processor 134 may release the first to third data chunks D1 to D3, which are considered the normal data chunk, from the write buffer 146 after transferring the first to third data chunks D1 to D3 to the memory device 150. Even if the program operation regarding the normal data chunk fails, the processor 134 can transfer the backup data chunk corresponding to the normal data chunk from the backup memory 148 to the memory device 150 through the memory interface 142.

On the other hand, the processor 134 may maintain the fourth data chunk D4, which is considered the non-backup data chunk, without releasing the fourth data chunk D4 from the write buffer 146, after transferring the data chunk D4 to the memory device 150. When the program operation regarding the non-backup data chunk fails, the processor 134 may transfer the non-backup data chunk from the write buffer 146 to the memory device 150 through the memory interface 142.

When the program operation regarding the non-backup data chunk is successfully completed in the memory device 150, the processor 134 may release the non-backup data chunk from the write buffer 146. Further, when the program operation regarding the backup data chunk is successfully completed in the memory device 150, the processor 134 may release (remove) the backup data chunk from the backup memory 148.

According to an embodiment of the present disclosure, the controller 130 can adjust a program sequence in which plural data chunks are programmed in the memory device 150 so that a program operation regarding the non-backup data chunk can be more quickly completed than that regarding the backup data chunk. Accordingly, the controller 130 can release the non-backup data chunk from the write buffer 146 faster. According to an embodiment of the present disclosure, the number of data chunks buffered in the write buffer 146 can be reduced so that the controller 130 can secure an available space for another program operation in the write buffer 146, while the controller 130 can hold the backup data chunk in the backup memory 148 until the program operation regarding the backup data chunk is successfully completed.

The program sequence in which plural data chunks are programmed in the memory device 150 will be described in detail with reference to FIGS. 4 to 6.

Figure 4:
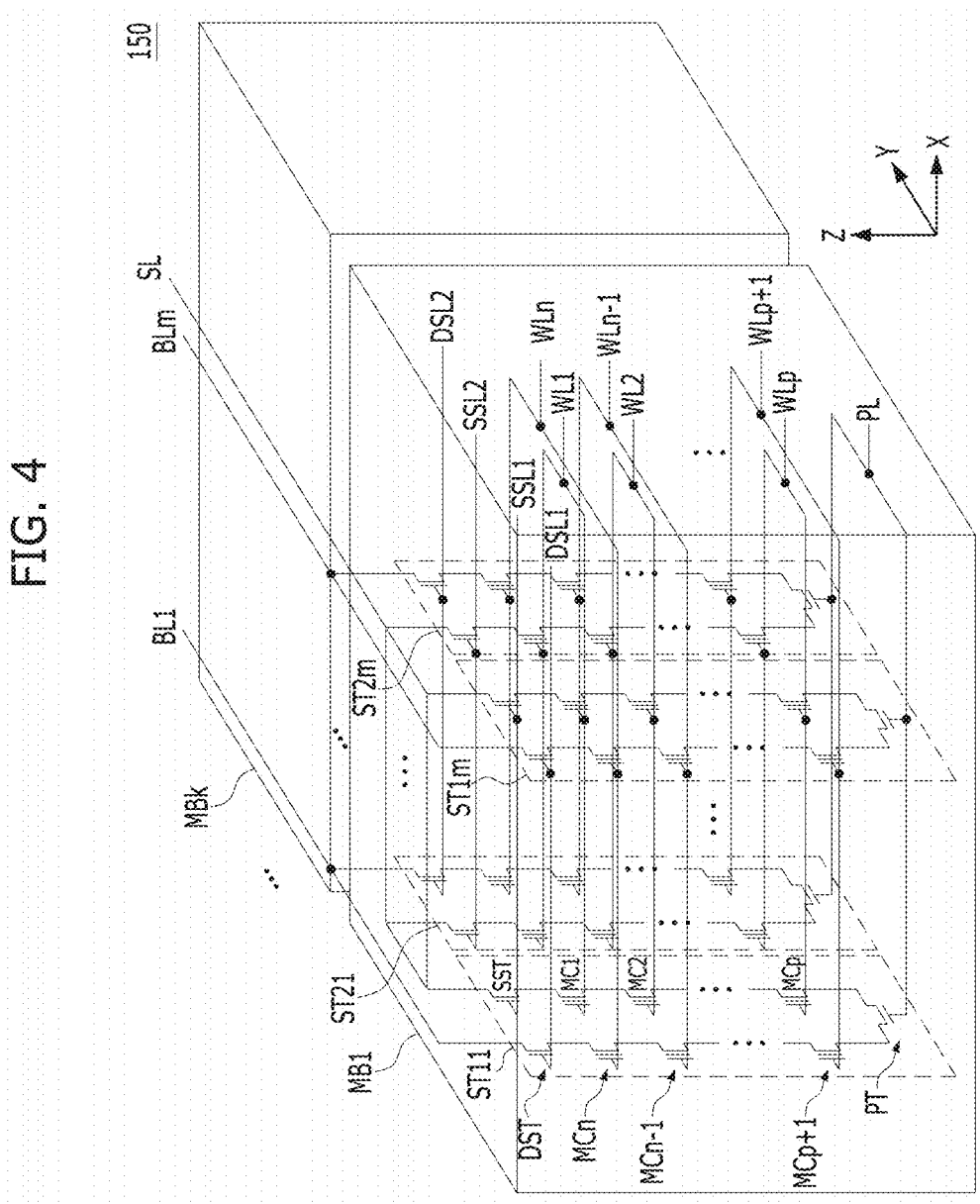
FIG. 4 is a diagram illustrating a three-dimensional memory cell array in a memory device according to an embodiment of the present disclosure.

FIG. 4 is a diagram illustrating a three-dimensional memory cell array in a memory device 150 according to an embodiment of the present disclosure.

Referring to FIG. 4, the memory device 150 may include a plurality of memory blocks MB1 to MBk. Each of the memory blocks MB1 to MBk may include a plurality of strings ST11 to ST1$m$, ST21 to ST2$m$. In an embodiment, each of the plurality of strings ST11 to ST1$m$, ST21 to ST2$m$ may be formed in a 'U' shape. In a first memory block MB1, 'm' number of strings may be arranged in a row direction (X direction), where 'm' is a natural number. In FIG. 6, it is illustrated that two strings are arranged in the column direction (Y direction), but this is for convenience of description. For example, three or more strings may be arranged in the column direction (Y direction).

Each of the plurality of strings ST11 to ST1$m$, ST21 to ST2$m$ can include at least one source select transistor SST, first to n-th memory cells MC1 to MCn, a pipe transistor PT, and at least one drain select transistor DST, where 'n' is a natural number.

The source and drain select transistors SST, DST and the memory cells MC1 to MCn may have structures similar to each other. For example, each of the source and drain select transistors SST, DST and the memory cells MC1 to MCn may include a channel layer, a tunnel insulating layer, a charge trap layer, and a blocking insulating layer. For example, a pillar for providing a channel film may be provided in each string. For example, a pillar for providing at least one of a channel layer, a tunnel insulating layer, a charge trap layer, and a blocking insulating layer may be included in each string.

The source select transistor SST of each string may be coupled between a source line SL and the memory cells MC1 to MCp.

In an embodiment, the source select transistors SST of strings arranged in the same row may be coupled to a source select line extending in a row direction, and source select transistors SST of strings arranged in different rows may be coupled to different source select lines. In FIG. 4, the source select transistors SST of the strings ST11 to ST1$nn$ of the first row may be coupled to a first source select line SSL1. The source select transistors SST of the strings ST21 to ST2$m$ of the second row may be coupled to the second source select line SSL2.

In another embodiment, the source select transistors SST of the strings ST11 to ST1$nn$, ST21 to ST2$m$ may be commonly coupled to a single source select line.

The first to nth memory cells MC1 to MCn of each string may be serially coupled between the source select transistor SST and the drain select transistor DST.

The first to nth memory cells MC1 to MCn may be divided into at least two groups: one is first to pth memory cells MC1 to MCp and the other is (p+1)th to nth memory cells MCp+1 to MCn. The first to pth memory cells MC1 to MCp may be sequentially arranged in the vertical direction (Z direction), and may be coupled in series between the source select transistor SST and a pipe transistor PT. The (p+1)th to nth memory cells MCp+1 to MCn may be sequentially arranged in the vertical direction (Z direction), and may be connected in series between the pipe transistor PT and the drain select transistor DST. The first to p-th memory cells MC1 to MCp and the (p+1)th to n-th memory cells MCp+1 to MCn may be coupled to each other through the pipe transistor PT. Gates of the first to nth memory cells MC1 to MCn of each string may be individually coupled to the first to nth word lines WL1 to WLn.

In an embodiment, at least one of the first to nth memory cells MC1 to MCn may be used as a dummy memory cell. When the dummy memory cell is included in a string, a voltage or a current of the corresponding string can be stably controlled. A gate of the pipe transistor PT of each string may be coupled to a pipeline PL.

The drain select transistor DST of each string may be coupled between a bit line and the memory cells MCp+1 to MCn. Strings arranged in the row direction may be coupled to a drain select line extending in the row direction. The drain select transistors of the strings ST11 to ST1nn of the first row may be coupled to the first drain select line DSL1. The drain select transistors of the strings ST21 to ST2m of the second row may be coupled to the second drain select line DSL2.

Strings arranged in the column direction may be coupled to bit lines extending in the column direction. In FIG. 4, the strings ST11 and ST21 of the first column may be coupled to a first bit line BL1. The strings ST1m and ST2m of the m-th column may be coupled to the m-th bit line BLm. Among the strings arranged in the row direction, memory cells coupled to the same word line may constitute a single physical page. For example, among the strings ST11 to ST1m of the first row, memory cells connected to the first word line WL1 may constitute a single physical page. Among the strings ST21 to ST2m of the second row, memory cells connected to the first word line WL1 may constitute another physical page. When any of the drain select lines DSL1, DSL2 is selected, strings arranged in a single row direction may be selected. When any of the word lines WL1 to WLn is selected, a single physical page among the selected strings may be selected.

The memory device 150 includes a plurality of single-level cell (SLC) memory blocks for storing single-bit data in a single memory cell, a multi-level cell (MLC) memory block for storing multi-bit data in a single memory cell, and the like. The SLC memory blocks may include a plurality of pages implemented as non-volatile memory cells, each storing a single bit data. The SLC memory block may have high durability and fast data operation performance. On the other hand, the MLC memory block may include a plurality of pages implemented as non-volatile memory cells, each storing a multi-bit data, such as data of two or more bits. For example, the MLC memory block can include a dual level cell (DLC) memory block capable of storing 2-bit data in a single memory cell, a triple level cell (TLC) memory block capable of storing 3-bit data in a single memory cell, or a quadruple level cell (QLC) memory block capable of storing 4-bit of data in a single memory cell. The MLC memory blocks may have a larger data storage capability than the SLC memory blocks. That is, the MLC memory block may be highly integrated, that is, a great stored data size per a unit area.

The memory device 150 may perform a multi-step program operation to program multi-bit data in a single memory cell. For example, in order to program the dual level cell DLC, the memory device 150 may perform a first step program operation of programming data corresponding to a least significant bit (LSB) data among 2-bit data of the dual level cell DLC. After performing the first step program operation, the memory device 150 may program a second step program operation of programming data corresponding to a Most Significant Bit (MSB) data among the 2-bit data of the dual level cell DLC to perform the 2-bit data of the dual level cell DLC. Each step program operation can include a plurality of program loops. Hereinafter, a program operation including a plurality of step program operations is referred to as a multi-step program operation.

Figure 5:
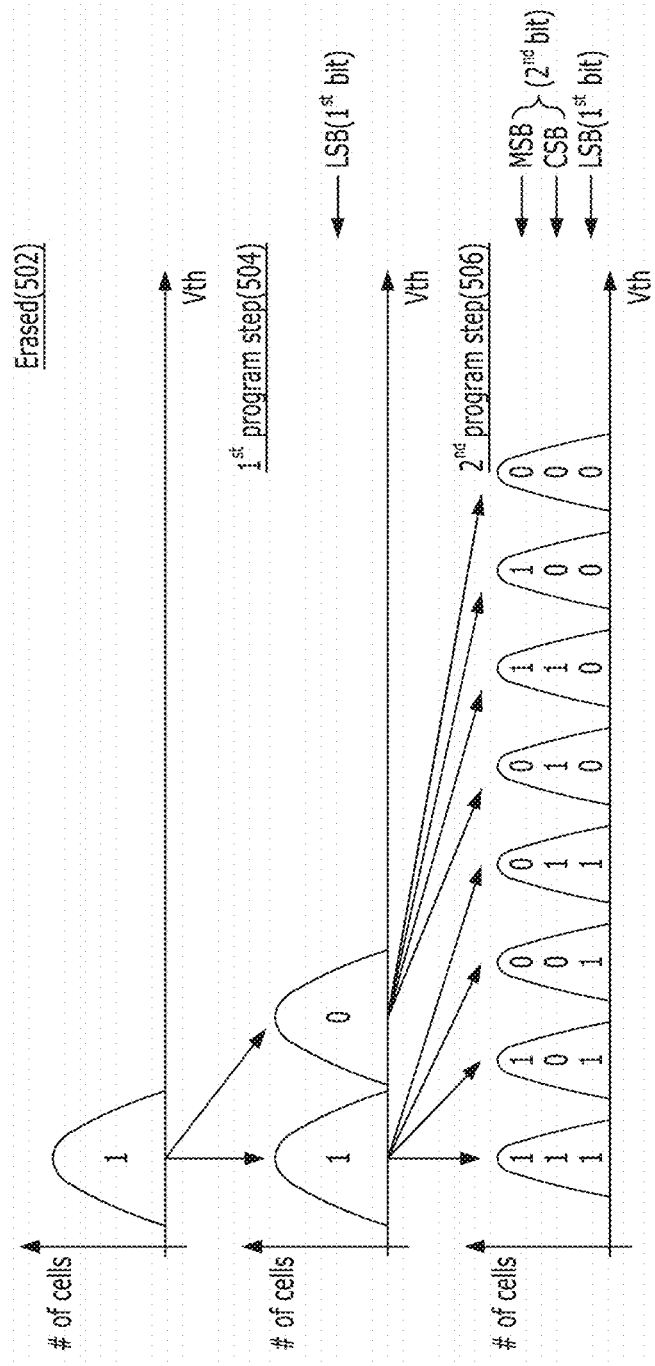
FIG. 5 is a diagram illustrating a multi-step program operation performed in a memory device according to an embodiment of the present disclosure.

FIG. 5 is a diagram illustrating a multi-step program operation performed in the memory device according to an embodiment of the present disclosure.

FIG. 5 illustrates a distribution diagram showing plural threshold voltage states of TLCs as an example of memory cells. In the distribution diagram, a horizontal axis indicates threshold voltage levels of the memory cells, and a vertical axis indicates the number of memory cells having the corresponding threshold voltage levels.

A first distribution diagram 502 shows that all of the memory cells have an erased threshold voltage state i.e., erased memory cells before the program operation is performed. In the first distribution diagram 502, all memory cells may have an erased state e.g., a blank page or a free block. In FIG. 5, the memory cells having the erased state can be recognized to store data of logic '1'.

A second distribution diagram 504 shows threshold voltage states of the memory cells after a first step program operation is completed. In the first step program operation, at least some of the memory cells are programmed, but others of the memory cells are not programmed. The memory device 150 may first program first bit data, for example, least significant bit (LSB) data among multi-bit data stored in each memory cell. The operation of programming the first bit data is referred to as a first step program operation. To perform the first step program operation, the memory device 150 may receive the first bit data transferred from the controller 130. When the memory device 150 performs the first step program operation on the memory cells based on the first bit data, a threshold voltage level of some memory cells having the erased state may be shifted to a program state. In FIG. 5, some memory cells can be recognized to store data of logic '0,' and the other memory cells can be recognized to store data of logic '1'.

A third distribution diagram 506 shows threshold voltage states of the memory cells after the memory device 150 performs a second step program operation. After the first bit data is programmed, the memory device 150 adds other bit data, for example, central significant bit (CSB) data and most significant bit (MSB) data, among the multi-bit data stored in each memory cell. An operation of programming the other bit data after the first step program operation can be referred to as a second step program operation. The memory device 150 may perform the second step program operation on the memory cells using the central significant bit (CSB) data and the most significant bit (MSB) data. According to an embodiment, in order to perform the second step program operation, the memory device 150 may receive second bit data and third bit data transferred from the controller 130. In another embodiment, the memory device 150 can temporarily store, or back up, either the second bit data or the third bit data input from the controller 130, in a SLC buffer or other memory cells, before performing the second step program operation. When the memory device 150 performs the second step program operation on the memory cells, all of the MSB data, the CSB data, and the LSB data can be programmed. In FIG. 5, the memory cells may be recognized to store data of logic '111', '101', '001', '011', '010', '110', '100', and '000'.

FIG. 5 illustrates the multi-step program operation used for the TLC memory block. For example, the multi-step program operation can be applicable to various types of MLC memory blocks. When the memory device 150 performs the multi-step program operation on the DLC memory block, memory cells can have two distinguishable threshold voltage states based on LSB data among 2-bit data through the first step program operation. Through the second step program operation, the memory cells in the memory device 150 may be finally programmed with four threshold voltage states from the two threshold voltage states, according to the MSB data.

When a program operation is performed on a certain physical page, program disturbance may occur in which the threshold voltage distribution of an adjacent physical page is also changed due to word line coupling. When programming a plurality of physical pages, a program sequence of the memory device 150 may be determined in order to reduce or avoid the program disturbance.

FIG. 6 describes a program sequence of data in the memory device performing the multi-step program operation according to an embodiment of the present disclosure.

When the memory device 150 includes an MLC memory block, each physical page may include a plurality of subpages. For example, when the memory device 150 is a DLC memory block, each physical page may include a first bit page and a second bit page.

In the illustrated example of FIG. 6, a first table 600 shows a program sequence for programming subpages included in a single memory block. In the first table 600, first to eighth drain select lines DSL1 to DSL8 are shown in a first row of the first table 600, and first to third word lines WL1 to WL3 are shown in a first column. As described with reference to FIG. 4, a physical page in a single memory block may be selected to be programmed through a drain select lines DSL and a word lines WL. Herein, a physical page selected through an X-th word line and a Y-th drain select line may be referred to as a page XY PageXY. For example, a physical page specified through the first word line WL1 and the fourth drain select line DSL4 may be referred to as a page 14.

In a second column, the first bit data ($1^{st}$ bit) and the second bit data ($2^{nd}$ bit) of 2-bit data stored in memory cells coupled through each of the first to third word lines WL1 to WL3 are shown. Each entry of the first table 600 may correspond to each subpage. Numbers such as '1', '2', . . . , '40' included in each entry of the first table 600 indicate the program sequence of programming subpages with data.

If the memory device 150 continuously performs the second step program operation on memory cells coupled via an N-th word line directly after performing the first step program operation on the memory cells coupled via the N-th word line, threshold voltages of memory cells coupled to an (N+1)-th word line, which are in the erased state, can be greatly affected by program disturbance. In order to avoid an effect of program disturbance, another first step program operation is performed via the (N+1)-th word line after the first step program operation is performed via the N-th word line. Then, a second step program operation can be performed on the N-th word line.

For example, referring to the program sequence of '1' to '8' in the first table 600, the memory device 150 can perform the first step program operation regarding the first bit data of pages 11 to 18 coupled to the first word line WL1 in the memory block. Referring to the program sequences of '9' and '10', the memory device 150 can perform another first step program operation regarding the first bit data of a page 21 after the first step program operation regarding the first bit data of pages 11 to 18 is completed. After the first bit data of the page 21 is programmed, the memory device 150 can perform the second step program operation regarding the second bit data of a page 11. Referring to the program sequences of '11' to '24', the first bit data of pages 22 to 28 coupled to the second word line WL2 can be programmed by the first step program operation before the second bit data of pages 12 to 18 coupled via the first word line WL1 is programmed by the second step program operation, which is similar to a case of pages 11 and 21. Similarly, referring to the program sequence of '25' to '40', the memory device 150 can perform the first step program operation regarding the first bit data via the third word line WL3 before performing the second step program operation regarding the second bit data via the second word line WL2.

When both the first and second step program operations regarding a physical page are successfully completed, the multi-step program operation regarding the physical page can be finally completed. However, the second step program operation may fail even if the first step program operation is successfully completed. When the memory device 150 determines that the program operation regarding a specific physical page has failed, the memory device 150 can re-program the first bit data and second bit data on a different physical page. To ensure reliability of the memory system 110, the controller 130 may hold the first bit data and the second bit data until the second step program operation is completed.

In FIG. 6, the first step program operation on a page 21 may be performed at a ninth order of the program sequence, and the second step program operation may be performed at a 26th order of the program sequence. The program operation regarding the page 21 may be completed successfully after the second step program operation performed at the 26th order of the program sequence is completed. The controller 130 may keep or maintain a data chunk programmed at the ninth order until the second step program operation performed at the 26th order is completed. If the data chunk is a non-backup data chunk, the data chunk may be kept or maintained in the write buffer 146 until the second step program operation performed at the 26th order is completed.

If the non-backup data chunk is programmed at a 10th order, the non-backup data chunk may be programmed on a page 12 through the second step program operation. After the second step program operation performed at the 10th order is completed, the non-backup data chunk in the write buffer 146 can be released.

According to an embodiment of the present disclosure, the controller 130 can adjust the program sequence in which plural data chunks are programmed in the memory device 150, and quickly program the non-backup data chunks to be programmed via the second step program operation, so that the non-backup data chunks stored in the write buffer 146 can be released faster. An operation of the controller 130 according to an embodiment of the present disclosure will be described in detail with reference to FIGS. 7 to 9B.

Figure 7:
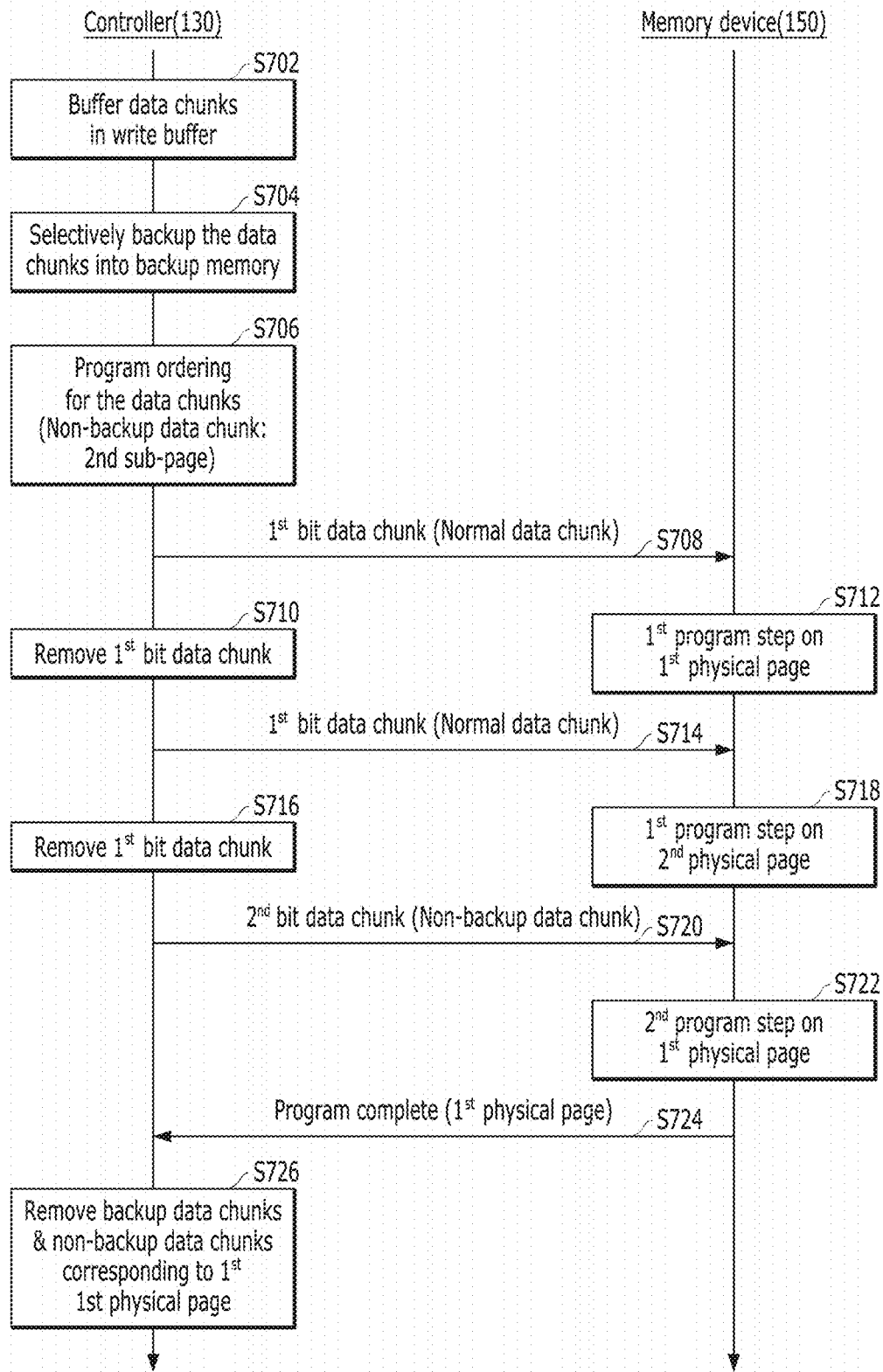
FIG. 7 illustrates a transaction between a controller and a memory device for performing a program operation according to an embodiment of the present disclosure.

FIG. 7 illustrates a transaction between a controller 130 and a memory device 150 for performing a program operation according to an embodiment of the present disclosure.

In operation S702, the write buffer 146 may buffer data chunks input through the host interface 132.

In operation S704, the backup memory 148 may selectively back up the data chunks input through the host interface 132. Some of the data chunks are backed up in the backup memory 148, while the others of the data chunks are discarded, e.g., not backed up in the backup memory 148.

In various embodiments, the operations S702, S704 may be performed in parallel through the main data path 302 and the backup data path 304 described with reference to FIG. 3. The data chunks input through the host interface 132 are duplicated and distributed over the main data path 302 and the backup data path 304.

In operation S706, the processor 134 may determine the program sequence in which the data chunks buffered in the write buffer 146 are programmed in the memory device 150. For example, the processor 134 can adjust the program sequence so that the non-backup data chunk can be programmed as a second bit data, not a first bit data, among multi-bit data stored in each non-volatile memory cell.

In operation S708, the memory interface 142 may transfer a data chunk, which is to be programmed as the first bit data on a first physical page, to the memory device 150. Herein, the data chunk to be programmed as the first bit data may be referred to as a first bit data chunk. According to an embodiment of the present disclosure, the first bit data chunk may always be a normal data chunk, i.e., a backup data chunk.

After the memory interface 142 transfers the first bit data chunk to be programmed on the first physical page to the memory device 150, the processor 134 may release (remove) the first bit data chunk from the write buffer 146 in the operation S710.

In operation S712, the memory device 150 may perform the first step program operation on the first physical page based on the first bit data chunk input from the controller 130.

In operation S714, the memory interface 142 may transfer another first bit data chunk, which is to be programmed on a second physical page following the first physical page, to the memory device 150.

Directly after the first bit data chunk regarding the second physical page is transferred into the memory device 150, the processor 134 may release the first bit data chunk from the write buffer 146 in operation S716, before the first bit data chunk is not yet completely programmed on the second physical page.

In operation S718, the memory device 150 may perform the first step program operation on the second physical page, based on the first bit data chunk transferred from the controller 130.

In operation S720, the memory interface 142 may transfer a second bit data chunk, which is a data chunk to be programmed as a second bit data of the first physical page, to the memory device 150. According to an embodiment of the present disclosure, the second bit data chunk may be a non-backup data chunk or a normal data chunk. FIG. 7 illustrates a case in which the second bit data chunk is a non-backup data chunk. Even after the second bit data chunk is transferred to the memory device 150, the processor 134 can hold or keep the second bit data chunk in the write buffer 146 without releasing the second bit data chunk from the write buffer 146.

In operation S722, the memory device 150 may perform a second step program operation on the first physical page, based on the second bit data chunk transferred from the controller 130.

When both the first step program operation in the operation S712 and the second step program operation in the operation S722 are successfully completed, the memory device 150 may transfer a program completion signal regarding the first physical page to the controller 130 in operation S724.

In operation S726, in response to the program completion signal, the processor 134 may release (remove) both the backup data chunk and the non-backup data chunk, which are programmed on the first physical page, from both the backup memory 148 and the write buffer 146. The processor 134 may release the backup data chunk, which corresponds to the first bit data chunk programmed on the first physical page, from the backup memory 148. Further, the processor 134 may release the non-backup data chunk, which corresponds to the second bit data chunk programmed on the first physical page, from the write buffer 146.

Hereinafter, an operation method regarding how the processor 134 determines the program sequence so that the non-backup data chunk can be programmed through a second step program operation will be described in detail with reference to FIG. 8.

Figure 8:
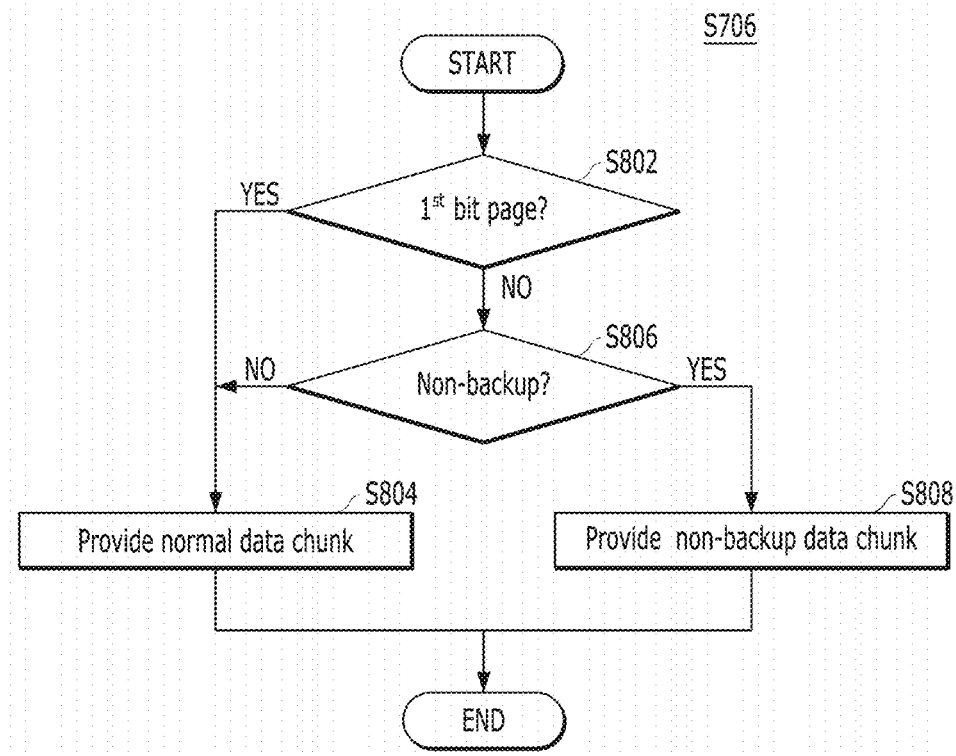
FIG. 8 illustrates an operation performed by a controller according to an embodiment of the present disclosure.

FIG. 8 illustrates an operation S706 of FIG. 7 performed by the controller according to an embodiment of the present disclosure.

In operation S802, the processor 134 may determine, based on a program sequence, whether the first step program operation is performed in the memory device 150. An example of the program sequence of programming data in the memory device 150 has been described with reference to FIG. 6.

In operation S804, when it is determined that the memory device 150 performs the first step program operation ("YES" of the operation S802), the processor 134 can determine the program sequence so that a normal data chunk is selected from among the data chunks buffered in the write buffer 146 and programmed through the first step program operation. For example, the processor 134 may determine the program sequence so that the oldest data chunk among the normal data chunks buffered in the write buffer 146 is the earliest programmed in the memory system 150 through the first step program operation.

If the oldest data chunk among data chunks buffered in the write buffer 146 is a non-backup data chunk, the processor 134 may defer the oldest data chunk. For example, when the oldest data chunk is a non-backup data chunk and the second oldest data chunk is the backup data chunk, the processor 134 can determine that the second oldest data chunk is earlier programmed than the oldest data chunk, because the second oldest data chunk, i.e., the backup data chunk, can be faster released from the write buffer 146.

To perform the second step program operation ("NO" of the operation S802), the processor 134 can determine whether the oldest data chunk among the data chunks buffered in the write buffer 146 is a non-backup data chunk, in operation S806.

When the oldest data chunk buffered in the write buffer 146 (YES in the operation S806) is a non-backup data chunk, the processor 134 can determine the program sequence in operation S808 so that the non-backup data chunk is transferred (provided) to the memory device 150 and programmed via the second step program operation. For example, the controller 130 may determine the program sequence so that the oldest data chunk among the non-backup data chunks buffered in the write buffer 146 is transferred and programmed for the second step program operation.

If only normal data chunks are buffered in the write buffer 146 (NO in the operation S806), i.e., all data chunks buffered in the write buffer 146 are backup data chunks, the processor 134 can determine the program sequence so that any normal data chunk buffered in the write buffer 146, e.g., the oldest data chunk, is transferred (provided) and programmed for the second step program operation.

According to an embodiment of the present disclosure, a non-backup data chunk may be later programmed in the memory device 150 than a backup data chunk, i.e., a normal data chunk, which is later input than the non-backup data chunk. For example, a normal data chunk input later than a non-backup data chunk may be programmed as a first bit data of the second physical page, and the non-backup data chunk may be programmed as a second bit data of the first physical page in which the first step program operation is earlier performed than the second physical page.

A backup data chunk programmed as the first bit data of the second physical page may be released from the write buffer 146 by the processor 134 directly after the data chunk is transferred for the second step program operation regarding the second bit data of the second physical page. However, a non-backup data chunk can be released from the write buffer 146 when the second bit data of the first physical page is successfully programmed. Accordingly, a hold time of the non-backup data chunk and the backup data chunk buffered in the write buffer 146 could be reduced.

FIGS. 9A and 9B illustrate operations performed by the controller 130 according to an embodiment of the present disclosure. The operation of the controller 130 will be described with reference to specific examples of FIGS. 9A and 9B.

FIG. 9A illustrates data chunks buffered in the write buffer 146.

In FIG. 9A, a plurality of data chunks may be buffered in the write buffer 146 in an input order (e.g., ascending order) of first to twenty-fourth data chunks D1 to D24. Among the plurality of data chunks, normal data chunks are marked as a rectangle with a dot pattern, while non-backup data chunks are shown as a rectangle with a hatched pattern. Fourth, seventh, eleventh, fifteenth, eighteenth, and twenty-third data chunks D4, D7, D11, D15, D18, D23 among the first to twenty-fourth data chunks D1 to D24 are the non-backup data chunks, while the other data chunks are the backup data chunks (i.e., normal data chunks). Hereinafter, the operation of the controller 130 will be described.

FIG. 9B describes the program sequence in which data chunks buffered in the write buffer 146 as shown in FIG. 9A are programmed.

A second table 900 shows the program sequence for subpages included in a single memory block and a data chunk to be programmed for each subpage. In the second table 900, DSL1 to DSL8 represent first to eighth drain select lines DSL1 to DSL8, respectively, and first and second columns represent a first bit page and a second bit page of each of first to third word lines WL1 to WL3. PO represents a program sequence for subpages and D represents data chunk. Each data chunk D can be programmed in each subpage according to the program sequence PO. The program sequence for programming plural subpages in the second table 900 can be substantially same as that described with reference to the first table 600 of FIG. 6.

Referring to FIG. 9B, first to third data chunks D1 to D3 which are normal data chunks buffered in the write buffer 146 are programmed in subpages corresponding to the program sequence of '1' to '3'.

According to an embodiment of the present disclosure, the program sequence may be determined so that the fourth data chunk D4, which is a non-backup data chunk, can be programmed through the second step program operation. In FIG. 9B, the fourth data chunk D4 might not be transferred and programmed at any of subpages corresponding to the program sequence of '4' to '9' but can be transferred and programmed at a subpage corresponding to the program sequence of '10'. Other normal data chunks input later than the fourth data chunk D4 may be programmed to subpages corresponding to the program sequence of '4' to '9' through the first step program operation.

In FIG. 9B, the program sequence in which data chunks, not only the first to fourth data chunks D1 to D4 but also the fifth to 24th data chunks D5 to D24, are programmed to subpages in which each data chunk is programmed are shown in the second table 900. In FIG. 9B, a normal data chunk to be programmed on a subpage is marked with a dot pattern, a non-backup data chunk to be programmed on a subpage is marked with a hatched pattern, and a subpage not marked with any pattern may be in an erased state.

In FIG. 9B, all of the non-backup data chunks may be programmed as the second bit data, whereas the normal data chunks may be programmed as the first bit data or the second bit data.

As shown in FIG. 9B, the program sequence can be adjusted so that the non-backup data chunks can be programmed as the second bit data. Data chunks buffered in the write buffer 146 can be more quickly released from the write buffer 146 when the data chunks are programmed in an input order than when the program sequence of the data chunks is adjusted.

In a first example, according to an embodiment of the present disclosure, the fourth data chunk D4 may be programmed as the second bit data at a page 11. The fourth data chunk D4 may be buffered in the write buffer 146 in a fourth order of the program sequence and programmed in the memory device 150 in a tenth order (10) of the program sequence. When programming is successfully completed as the second bit data at the page 11, the fourth data chunk D4 may be released from the write buffer 146. In contrast, if the fourth data chunk D4 is programmed in the fourth order as in an input order of the write buffer 146, the fourth data chunk D4 may be programmed as the first bit data at a page 14. The fourth data chunk D4 may be released from the write buffer 146 after the second step program operation regarding the fourth data chunk D4 is successfully completed as the second bit data at the page 14, and the second bit data at the page 14 may be programmed at a 16th order (16).

In a second example, a data chunk D23 may be programmed as the second bit data at a page 18 in a twenty-fourth order (24). The data chunk D23 may be released from the write buffer 146 when a program operation of the twenty-fourth order is successfully completed. But, when the data chunk D23 is programmed in a twenty-third order, the data chunk D23 may be programmed as the first bit data at a page 28. The second bit data at the page 28 may be completely programmed in a 40th order, so that the data chunk D23 may be released from the write buffer 146 after the program operation in the 40th order is successfully completed.

In an embodiment, the program sequence can be adjusted so that the fourth data chunk D4, the 23rd data chunks D23 and the other non-backup data chunks can be programmed as the second bit data. Accordingly, the holding time of the non-backup data chunks stored in the write buffer 146 can be reduced or kept when the program sequence is adjusted, as compared with a scheme in which data chunks are programmed on subpages of the memory device 150 in an input order.

According to an embodiment of the present disclosure, the controller 130 can buffer data chunks, which are transferred through the main data path 302 to be programmed in the memory device 150, in the write buffer 146. The controller 130 can back up some of the data chunks, transferred through the backup data path 304, in the backup memory 148 to avoid a bottleneck. The controller 130 may determine a program sequence of the data chunks. Specifically, the controller 130 may determine the program sequence to program a non-backup data chunk through the second step program operation. When the non-backup data chunk is programmed as the second bit data through the second step program operation, the controller 130 can release the non-backup data chunk from the write buffer 146 faster after transferring the non-backup data chunk to the memory device 150. Accordingly, the holding time of the non-backup data chunk in the write buffer 146 can be reduced, so that the controller 130 can avoid accumulation of data chunks in the write buffer 146.

Although embodiments of the present disclosure have been described with reference to the case in which the memory device 150 includes a DLC memory block and performs a two-step program operation in FIGS. 5 to 9B as an example, the scope of embodiments according to the present disclosure should not be limited to the example of FIGS. 5 to 9B.

In a first example, the embodiment can be applicable to a case in which the memory device 150 includes a TLC memory block. LSB data is programmed through the first step program operation, while CSB data and MSB data are programmed through the second step program operation. In determining the program sequence of the data chunks, the controller 130 may adjust the program order so that the non-backup data chunks are programmed at the CSB page or the MSB page in the TLC memory block.

In a second example, the embodiment can also be applicable to a case in which the memory device 150 programs a physical page through three or more step program operations. In determining the program sequence of the data chunks, the controller 130 may adjust the program order so that the non-backup data chunk is programmed through the last step program operation of the three or more step program operations.

According to an embodiment of the present disclosure, the controller 130 can hold or maintain all of the data chunks in the write buffer 146 or the backup memory 148 until the program operation regarding each of the data chunks is completed, like a scheme when all of the data chunks would be kept or maintained in the controller 130. In addition, according to an embodiment of the present disclosure, a bottleneck of the backup memory 148 can be avoided so that a write operation speed of the memory system 110 can be improved as compared to the conventional case of backing up all of the data chunks, which are buffered in the write buffer 146, in the backup memory 148. Further, according to an embodiment of the present disclosure, because the controller 130 might avoid accumulation of non-backup data chunks in the write buffer 146, increased storage capacity required in the write buffer 146 implemented as a high-speed memory might not be required, as compared to the conventional case of backing up all of the data chunks, which are buffered in the write buffer 146, in the backup memory 148. Accordingly, while performance of the memory system 110 is improved and reliability is maintained, an increase in a manufacturing cost or a circuit size of the memory system 110 can be avoided.

An embodiment may provide a controller and an operating method of the controller capable of reducing a manufacturing cost of the memory system while improving or maintaining performance and reliability of the memory system.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. An operation method of a controller controlling a memory device including multi-level cells programmed with data through a multi-step program operation, the method comprising:

buffering data chunks to be programmed in the multi-level cells in a write buffer;

backing up at least one first data chunk of the data chunks to a backup memory which is distinguished from the write buffer; and controlling the memory device to program the data chunks in the multi-level cells through the multi-step program operation including a first step program operation with the at least one first data chunk and a second step program operation with at least one second data chunk of the data chunks, wherein the first step program operation is performed after the at least one first data chunk is backed up.

2. The operation method according to claim 1, wherein the first step program operation is for storing the at least one first data chunk as at least one first bit data in first multi-level cells, coupled to a first word line, among the multi-level cells while the second step program operation is for storing the at least one second data chunk as at least one second bit data in the first multi-level cells.

3. The operation method according to claim 2, wherein the second step program operation is performed after the first step program operation.

4. The operation method according to claim 2, wherein the second step program operation is performed after another first step program operation is performed in second multi-level cells, coupled to a second word line, among the multi-level cells.

5. The operation method according to claim 4, wherein the second word line is adjacent to the first word line.

6. The operation method according to claim 4, further comprising:

determining a program sequence of the data chunks, the program sequence for programming the data chunks through the multi-step program operation.

7. The operation method according to claim 6, wherein the determining the program sequence comprises:

determining the program sequence for programming the at least one first data chunk of the data chunks through the first or second step program operation;

determining the program sequence for programming a first chunk of the at least one first data chunk through the first step program operation;

determining the program sequence for programming the at least one second data chunk through the second step program operation when the at least one second data chunk is buffered in the write buffer; and determining the program sequence for programming a second chunk of the at least one first data chunk through the second step program operation when there is no second data chunk.

8. The operation method according to claim 1, further comprising:

transferring each second data chunk in the write buffer to the memory device; and releasing the transferred second data chunk from the write buffer after performing the second step program operation regarding the transferred second data chunk.

9. The operation method according to claim 8, further comprising:

re-transferring the transferred second data chunk to the memory device when the second step program operation regarding the transferred second data chunk has failed.

10. The operation method according to claim 1, further comprising:
    transferring each first data chunk in the write buffer to the memory device; and
    releasing the transferred first data chunk from the write buffer after transferring the first data chunk and before performing the first or the second step program operation regarding the transferred first data chunk.

11. The operation method according to claim 10, further comprising:
    releasing the transferred first data chunk from the backup memory after performing the first or second step program operation regarding the transferred first data chunk.

12. The operation method according to claim 11, further comprising:
    re-transferring the transferred first data chunk to the memory device when the first or second step program operation regarding the transferred first data chunk has failed.

13. The operation method according to claim 1, wherein the backing up the at least one first data chunk of the data chunks comprises:
    discarding at least one data chunk of the data chunks transferred into the backup memory to avoid a bottleneck in a data path in which the data chunks input from a host are transmitted,
    wherein the write buffer has an operation speed faster than that of the backup memory.

14. The operation method according to claim 13, wherein the backing up the at least one first data chunk of the data chunks comprises:
    buffering at least one data chunk of the data chunks in a temporary buffer when there is an available space in the temporary buffer and then backing up the at least one data chunk, buffered in the temporary buffer, in the backup memory; and
    discarding the at least one data chunk of the data chunks when there is no available space in the temporary buffer.

15. A memory system, comprising:
    a memory device comprising multi-level cells programmed with multi-bit data through a multi-step program operation; and
    a controller for controlling the multi-step program operation performed in the memory device,
    wherein the controller is engaged with a write buffer and a backup memory distinguished from the write buffer, and
    wherein the controller is configured to:
    buffer the data chunks to be programmed in the multi-level cells in the write buffer;
    back up the at least one first data chunk to the backup memory; and
    control the memory device to program the at least one first data chunk in the multi-level cells through a first step program operation of the multi-step program operation and program at least one second data chunk of the data chunks in the multi-level cells through a second step program operation of the multi-step program operation,
    wherein the first step program operation is performed after the at least one first data chunk is backed up.

16. The memory system according to claim 15, wherein the write buffer is configured to buffer the data chunks to be programmed in the multi-level cells, while the backup memory is configured to back up the at least one first data chunk of the data chunks.

17. The memory system according to claim 15, wherein the first step program operation is for storing the at least one first data chunk as at least one first bit data in first multi-level cells, coupled to a first word line, among the multi-level cells while the second step program operation is for storing the at least one second data chunk as at least one second bit data in the first multi-level cells.

18. The memory system according to claim 17, wherein the second step program operation is performed after another first step program operation is performed in second multi-level cells, coupled to a second word line, among the multi-level cells.

19. The memory system according to claim 15, wherein the controller is further configured to determine a program sequence of the data chunks, the program sequence for programming the data chunks through the multi-step program operation.

20. The memory system according to claim 15, wherein the controller is further configured to:
    transfer each second data chunk in the write buffer to the memory device; and
    release the transferred second data chunk from the write buffer after performing the second step program operation regarding the transferred second data chunk.

* * * * *